United States Patent [19]

Maa

[11] Patent Number: 4,460,435
[45] Date of Patent: Jul. 17, 1984

[54] PATTERNING OF SUBMICROMETER METAL SILICIDE STRUCTURES

[75] Inventor: Jer-shen Maa, Somerset County, N.J.

[73] Assignee: RCA Corporation, New York, N.Y.

[21] Appl. No.: 562,530

[22] Filed: Dec. 19, 1983

[51] Int. Cl.³ .................. H01L 21/306; B44C 1/22; C03C 15/00; C03C 25/06
[52] U.S. Cl. .................. 156/643; 148/186; 156/646; 156/651; 156/657; 156/659.1; 156/662; 204/192 E; 252/79.1
[58] Field of Search .............. 427/38, 39, 85, 86, 427/299, 304, 309; 148/1.5, 186; 156/643, 646, 651, 657, 659.1, 662; 252/79.1; 204/192 EC, 192 E

[56] References Cited

U.S. PATENT DOCUMENTS 4,352,724 10/1982 Sugishima et al. ............ 204/192 E
4,372,034 2/1983 Bohr ............................. 29/577 C
4,411,734 10/1983 Maa .............................. 156/643
4,417,947 11/1983 Pan .............................. 156/643

FOREIGN PATENT DOCUMENTS 57-07936 1/1982 Japan ............................ 156/651

Primary Examiner—William A. Powell
Attorney, Agent, or Firm—Birgit E. Morris; R. Hain Swope

[57] ABSTRACT

A method is disclosed of forming elongated strips, e.g. interconnections, of a doped polycrystalline silicon/refractory metal silicide structure having a width less than about one micrometer over a vertical step in a substrate wherein the walls of the substrate, after etching, are free of impurity deposits called stringers. The subject method comprises isotropically etching said structure utilizing a resist pattern having a width substantially larger than one micrometer, redefining the resist pattern to the desired width and anisotropically etching the structure to the desired width.

18 Claims, 4 Drawing Figures

PATTERNING OF SUBMICROMETER METAL SILICIDE STRUCTURES

This invention pertains to a method of forming an elongated strip of conductive material having a width less than one micrometer over a step in the underlying substrate, wherein the strip consists of a metal silicide layer overlying a layer of doped polycrystalline silicon.

BACKGROUND OF THE INVENTION

The replacement of doped polycrystalline silicon structures with a two-layer structure comprising a layer of a refractory metal silicide overlying a layer of doped polycrystalline silicon to obtain improved lateral conductivity and enhanced speed is becoming increasingly common in the electronics industry. Such structures are commonly referred to as "polycide" structures.

Polycide structures are used in very high speed integrated circuits (VHSIC) as gate and interconnection materials. In such circuits, it is desirable that the width of the polycide line be as narrow as 0.5 micrometer. While it is possible to utilize an anisotropic etch to define a polycrystalline silicon/refractory metal silicide line of submicrometer width on a level plane, it is most difficult to do so when the line must transverse epitaxial silicon islands or other structures on a substrate which have vertical sidewalls. In accordance with this invention, a method has been found whereby a polycide elongated strip of submicrometer width running over vertical sidewalls or steps can be anisotropically defined without the problems encountered heretofore.

SUMMARY OF THE INVENTION

In accordance with this invention, an elongated strip of conductive material having a width less than about one micrometer and consisting of a layer of a refractory metal silicide overlying a layer of doped polycrystalline silicon is defined anisotropically over a vertical step in the underlying substrate by a two-step process comprising isotropically etching the two layers to define a strip structure utilizing a resist pattern having a width substantially larger than one micrometer, redefining the resist pattern to the desired width and anisotropicaly etching the remaining strip structure.

DETAILED DESCRIPTION OF THE INVENTION

The problem solved in accordance with this invention is that of the formation of a conductive residue on the sidewall of a vertical step during etching of a refractory metal silicide/doped polycrystalline silicon structure deposited thereover. Such residues are commonly referred to as "stringers". The formation of stringers on the vertical walls of the substrate causes serious shorting problems with regard to metal silicide interconnections passing thereover.

It must be emphasized that, although the problem of shorting caused by stringers occurs only when metal silicide/doped polycrystalline silicon, i.e. polycide, elongated strips of submicrometer width transverse a vertical wall, it is nonetheless serious because that situation will occur with increasing frequency in the quest for increased speed and smaller dimensions in high density semiconductor devices.

Previous attempts to resolve the problem of stringers have been ineffectual. For example, extended overetching has been proposed as a solution. Extended overetching, however, can remove the thin gate oxide covering underlying epitaxial silicon islands and damage the silicon itself. It has also been proposed that, once etching is completed, another layer of resist be deposited and defined to cover the polycide elongated strips, i.e. lines, and the stringers removed with a plasma etch. It is, of course, difficult to accurately cover an elongated strip of material 0.5 micrometer wide with a layer of resist. There is the added problem that the resist will penetrate into a gap, if any, between a stringer and an adjacent perpendicular wall. An extra processing step is usually required to remove such resist material. A final proposed approach to the problem of stringers is to attempt to remove them with an isotropic etch after definition of the polycide structure with an anisotropic etch. This approach has two disadvantages, viz. the polymer, if any, generated during the first etching step inhibits the effective removal of the stringers. Second, the sidewise etching of the isotropic etch can cause a significant reduction in line width of the polycide line. It will be appreciated that, with an elongated strip only about 0.5 micrometer wide, an undercut of only 1500 angstroms will cause a 60 percent loss of width.

In accordance with this invention, the initial pattern of resist material formed in a polycide structure contains at least an elongated strip having a width substantially in excess of one micrometer. While the amount of space available on the substrate must be taken into consideration, generally, the width of an elongated strip in the initial resist material pattern should be from about two to five times, preferably about four times, the desired final width of the polycide elongated strip. Factors such as the width of the final polycide elongated strip, the etch rates in the respective plasmas and the like will influence the chosen width of the initial elongated strip in the resist pattern.

Figure 1:
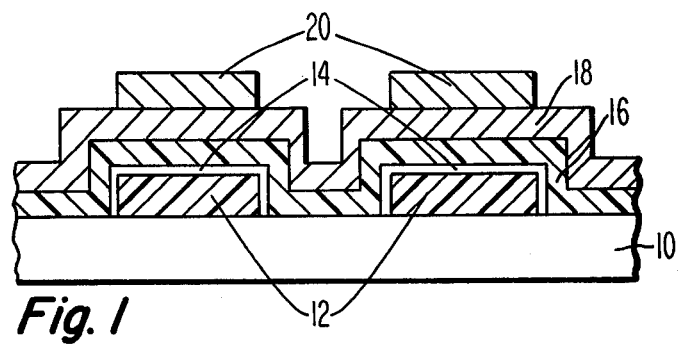
FIGS. 1-4 are elevational views in broken section illustrating the method of this invention.

A typical substrate depicted in FIG. 1 is comprised of a base layer 10, typically sapphire, upon which are two epitaxial silicon islands 12. The silicon islands are coated with a thin gate oxide layer 14. The gate oxide layer 14 is typically about 25 to 35 nanometers in thickness. The polycide structure deposited thereover comprises a layer of doped polycrystalline silicon 16 over which is a layer of refractory metal silicide 18.

The silicon is preferably deposited in the amorphous state by low pressure chemical vapor deposition (LPCVD) from a silicon-containing vapor such as silane at a temperature of 560°-580° C. The silicon layer 16 is then heated in a conventional furnace to a temperature of from about 850° to 950° C., preferably about 900° C., for from about five to fifteen minutes under an inert atmosphere such as nitrogen. This initial heating anneals the silicon and, when deposited in the amorphous state, converts it to the polycrystalline state. A polycrystalline silicon layer thus-formed is clearly superior in physical properties to a layer deposited in the polycrystalline state as disclosed by Widmer et al in copending U.S. patent application Ser. No. 441,371, filed Nov. 12, 1982, the disclosure of which is incorporated herein by reference.

The silicon layer 14 may be doped in-situ or by conventional diffusion techniques. In the former, a suitable dopant is added to the vapor containing silicon from which the layer is deposited. A preferred dopant is phosphine.

If the silicon layer is doped by diffusion, a suitable source of phosphorus is pumped into the furnace after the above-described heating step and the layer held for an additional period of time, generally from five to thirty minutes. Suitable phosphorus sources include elemental red phosphorus, phosphorus pentoxide, phosphorus trichloride and, preferably, phosphorus oxychloride.

The layer of refractory metal silicide 18 is deposited by any suitable technique, preferably by magnetron sputtering utilizing three targets. Any art-recognized refractory metal silicide can be used. Suitable metal silicides include tantalum, tungsten, titanium, niobium and molybdenum, with tantalum being preferred. The surface of the silicon is prepared for deposition of the metal silicide by plasma treatment with a mixture of carbon tetrafluoride and oxygen, preferably in a volume ratio of 97:3 as disclosed in U.S. Pat. No. 4,411,734, issued Oct. 25, 1983, the disclosure of which is incorporated herein by reference. The layer of tantalum silicide is preferably deposited tantalum rich. A preferred molar ratio is one part of tantalum per 1.6 parts of silicon. The metal silicide is thereafter conventionally annealed. Annealing is carried out by heating in an argon furnace at a temperature of from about 850° to 950°, preferably about 900° for thirty minutes. It is particularly preferred to anneal the metal silicide layer after etching as described in the above-mentioned U.S. patent.

A layer of resist material 20 is then deposited over the metal silicide layer 18, irradiated and developed to form a patterned layer including an elongated strip having a width substantially in excess of one micrometer. Generally, any resist material suitable for dry development can be utilized. Because of the topography of the substrate, a multilayer resist system comprising one or more planarizing layers and/or a plurality of resist layers may be advantageously utilized in the subject process. The term "layer of resist material" as utilized includes such multilayer resist systems. A preferred material, which may be used as a single layer or as part of a multilayer resist system, is a positive material available from Hunt Chemical Co. under the trademark HPR-204.

Figure 2:
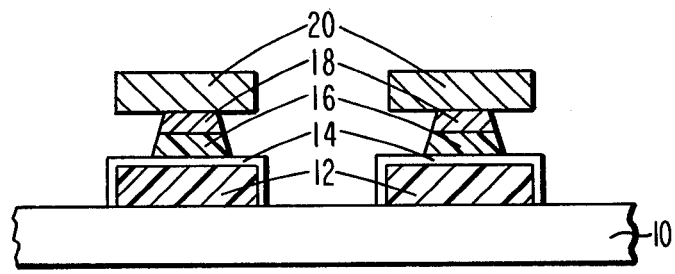

Using these elongated strips of resist material as a pattern, the metal silicide layer 18 and the underlying doped polycrystalline silicon layer 16 are etched using an isotropic etch mixture. The isotropic etch undercuts the resist pattern, thus forming the structure shown in FIG. 2. A preferred etching method is plasma etching utilizing an etch mixture of carbon tetrafluoride, carbon tetrachloride and oxygen in a 20:20:2 ratio by volume.

It is preferred that the first etch step of the subject process not be strickly isotropic, and that the vertical etch rate be greater than the sidewise etch rate. The manipulation of the etch mixture and/or the processing conditions, e.g. lowering the pressure to achieve such an etch is considered to be within the skill of the art.

Figure 3:
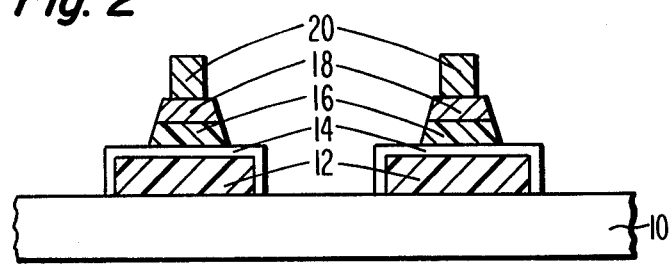

The resist pattern 20 in FIG. 2 is again irradiated and developed to reduce its width to the desired line width for the polycide elongated strips, thus producing the structure depicted in FIG. 3. Among technologies currently in use, electron beam irradiation is most suitable for the submicrometer patterning of the resist layer. It is preferred that patterning of the resist layer for both of the etching steps of this invention be effected by electron beam techniques. It is, of course, necessary that the resist layer have sufficient sensitivity and etch resistance, and be of sufficient thickness to withstand the etching steps contemplated herein. In FIG. 3 the width of the resist pattern 20 is less than the width of the polycide structure, i.e. layers 16 and 18, which has tapered sidewalls.

Figure 4:
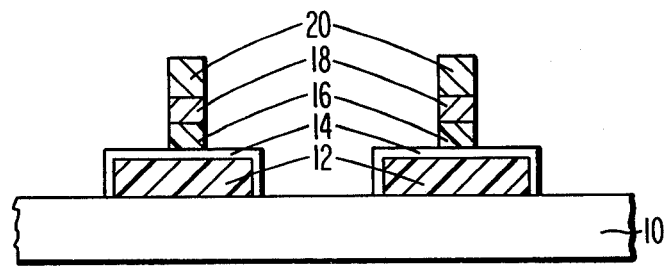

The polycide structure is thereafter etched using an anisotropic etch mixture comprising, for example, carbon tetrachloride, oxygen and nitrogen in volume percent of from about 30 to 80 parts of carbon tetrachloride, from about 1 to 6 parts of oxygen and from about 20 to 50 parts of nitrogen. The anisotropic etch produces the structure illustrated in FIG. 4. The remaining resist is then conventionally removed, e.g. by an oxygen plasma. The resulting structures have been found by electron microscopy to be cleanly etched and the vertical walls of the underlying substrates over which they pass to be free of stringers.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A three inch sapphire wafer was used as a substrate. Using a suitable mask, islands of silicon 5 micrometers×20 micrometers and 500 micrometers in height were grown on the wafer surface. The wafers were then heated in steam at 825° for 20 minutes to form a layer of silicon dioxide 25 nanometers thick on the islands.

The wafers were then placed in a LPCVD reactor in a quartz tube which was heated to 580°. Deposition of amorphous silicon was carried out at 350 mtorr pressure, 200 cm$^3$/min silane flow, for 40 minutes producing a layer of amorphous silicon 200 nanometers thick.

The wafers were then transferred to a diffusion furnace and heated under a nitrogen atmosphere to a temperature of 950° for 5 minutes, thus annealing the silicon layer and converting it to the polycrystalline state. The silicon layer was doped with phosphorus by flowing phosphorus oxychloride into the furnace and continuing heating for an additional 5 minutes. The wafers were withdrawn and allowed to return to ambient temperature over about 5 minutes.

The native oxide which formed on the surface of the polycrystalline silicon was removed by dipping the wafers for one minute into an aqueous solution containing 5 percent by volume of buffered hydrofluoric acid and 3 percent by volume of nitric acid. The wafers were rinsed and spin-dried in dry nitrogen.

The wafers were placed into a parallel electrode etching reactor. The upper electrode was grounded and the lower (substrate) electrode was powered to produce a voltage of 300 volts. The wafer electrode power was 300 watts and the pressure was 35 mtorr. The surface of the polycrystalline silicon was prepared for the deposition of the silicide by treatment for 1 minute with an etchant mixture of 97 sccm of carbon tetrafluoride and 3 sccm of oxygen.

The wafers were immediately placed into a conventional magnetron sputtering apparatus. Utilizing two phosphorus-doped silicon targets and one tantalum target, a layer of tantalum silicide 200 nanometers thick was deposited onto the polycrystalline silicon in an atmosphere of argon. The total pressure in the apparatus was 3 mtorr. The power applied to each of the three targets was adjusted in such a way that the layer deposited was tantalum rich, i.e. the layer was $TaSi_{1.6}$ instead of the stoichiometric proportion, i.e. $TaSi_2$.

A layer of a positive resist, HPR-204, Hunt Chemical Company, was spun onto the wafer to a thickness of 600 nanometers. The resist layer was irradiated with electron beam utilizing a scanning electron microscope equipped with a microprocessor. The resist was developed with an aqueous developer supplied by the manufacturer. There remained after development an elongated strip of resist material two micrometers wide passing over each of the silicon islands. The resist was then soft baked at 125° for 30 minutes.

The wafers were then returned to the parallel plate reactor and etched with an etchant mixture of 20 sccm of carbon tetrafluoride, 20 sccm of carbon tetrachloride and 2 sccm of oxygen for 7 minutes at 65 mtorr pressure. The electrodes were powered as above. It was noted that there was undercutting of the resist pattern and that the walls of the tantalum silicide/silicon structure were tapered. No stringers could be detected on the underlying substrate by electron microscope examination.

The remaining resist pattern was again irradiated with electron beam and developed leaving elongated strips of resist 0.5 micrometer in width passing over the tantalum silicide/silicon strips. The resist was baked at 120° for 30 minutes.

The wafers were then returned to the parallel plate reactor and etched with an etchant mixture of 23 sccm of carbon tetrachloride, 1 sccm of oxygen and 15 sccm of nitrogen for 15 minutes at 40 mtorr pressure. The upper electrode was powered at 100 watts and the lower electrode tuned to produce voltage to ground of −150 volts. The structure was anisotropically etched to the oxide surface. The wafers were then placed in a conventional barrel reactor and the remaining resist removed in an oxygen plasma. The wafers were then placed in a conventional furnace and annealed in an argon atmosphere at 900° for 30 minutes. The tantalum silicide structure transversing the silicon islands was found to be uniform with vertical walls. There was no evidence of stringers on the substrate which would cause shorting of the polycide lines.

I claim:

1. A method of forming an elongated strip of conductive material comprising a layer of doped polycrystalline silicon having thereover a layer of a refractory metal silicide on a substrate, said strip transversing a vertical step on the substrate and having a width less than about 1 micrometer, said method comprising:
(a) depositing a layer of doped polycrystalline silicon on the substrate;
(b) depositing a layer of a refractory metal silicide thereover;
(c) forming a patterned layer of resist material over the metal silicide layer, said pattern including an elongated strip having a width substantially larger than the desired width of said strip of conductive material;
(d) isotropically etching the exposed portion of the metal silicide layer and the underlying doped polysilicon layer to the substrate;
(e) irradiating and developing the remaining resist layer to reduce the width of said elongated strip to the desired width of said strip of conductive material; and
(f) anisotropically etching the exposed metal silicide layer and the underlying doped polycrystalline layer to form said elongated strip.

2. A method in accordance with claim 1, wherein the polycrystalline silicon layer is formed in the amorphous state by low pressure chemical vapor deposition from a vapor containing silicon at a temperature of from about 560° to 580° C. and annealed to convert it to the polycrystalline state.

3. A method in accordance with claim 2, wherein the vapor is silane.

4. A method in accordance with claim 2, wherein the silicon layer is doped in-situ by adding a suitable dopant to said vapor.

5. A method in accordance with claim 4, wherein said dopant is phosphine.

6. A method in accordance with claim 1, wherein the silicon layer is doped after deposition by diffusion from a source of phosphorus at a temperature of from about 850° to about 950° C.

7. A method in accordance with claim 6, wherein the source of phosphorus is phosphorus oxychloride.

8. A method in accordance with claim 1, additionally including the step of plasma treating the surface of the doped polycrystalline silicon with a mixture of carbon tetrafluoride and oxygen to prepare the surface for the deposition of the refractory metal silicide.

9. A method in accordance with claim 1, wherein the refractory metal silicide is tantalum silicide.

10. A method in accordance with claim 9, wherein said layer is deposited tantalum rich.

11. A method in accordance with claim 1, wherein the width of said elongated strip of resist material is from about 2 to 5 times the desired width of said strip of conductive material.

12. A method in accordance with claim 11, wherein the width of said elongated strip of resist material is about four times the desired width of said strip of conductive material.

13. A method in accordance with claim 1, wherein the isotropic etching in step (d) is plasma etching utilizing a mixture of carbon tetrafluoride, carbon tetrachloride and oxygen.

14. A method in accordance with claim 13, wherein said mixture comprises carbon tetrafluoride, carbon tetrachloride and oxygen in a ratio of about 20:20:2 by volume.

15. A method in accordance with claim 1, wherein said anisotropic etch in step (f) is a plasma etch using an etchant mixture of carbon tetrachloride, oxygen and nitrogen.

16. A method in accordance with claim 1, wherein said etchant mixture comprises, on a volume basis, from about 30 to about 80 percent of carbon tetrachloride, from about 1 to about 6 percent of oxygen and from about 20 to about 50 percent of nitrogen.

17. A method in accordance with claim 1, wherein the refractory metal silicide layer is annealed after said anisotropic etch step.

18. A method in accordance with claim 17, wherein the metal silicide layer is annealed in an argon atmosphere at a temperature of from abut 800° to about 950° C.

* * * * *